(12) United States Patent
Wang et al.

(10) Patent No.: US 6,587,095 B2
(45) Date of Patent: Jul. 1, 2003

(54) METHOD FOR FORMING SWITCHING CIRCUIT OF KEYBOARD WITHOUT GENERATING PHANTOM PHENOMENON

(75) Inventors: Tsung-Yu Wang, Taipei (TW); Shih-Jen Kuo, Taipei (TW); Yen-Liang Kuan, Taipei (TW)

(73) Assignee: Behavior Tech Computer Corporation, Taipei (TW)

( * ) Notice: Subject to any disclaimer, the term of this patent is extended or adjusted under 35 U.S.C. 154(b) by 232 days.

(21) Appl. No.: 09/859,385

(22) Filed: May 18, 2001

(65) Prior Publication Data

US 2002/0171632 A1 Nov. 21, 2002

(51) Int. Cl.$^7$ ................................................ G09G 5/00
(52) U.S. Cl. ...................................................... 345/168
(58) Field of Search ................................. 345/168, 172; 341/122, 126

(56) References Cited

U.S. PATENT DOCUMENTS

| | | | | |
|---|---|---|---|---|
| 3,991,305 A | * | 11/1976 | Caudel et al. | ............... 708/168 |
| 4,333,089 A | * | 6/1982 | Leininger | ..................... 341/26 |
| 4,774,689 A | * | 9/1988 | Morisawa | ..................... 345/157 |
| 5,973,675 A | * | 10/1999 | Joto et al. | ..................... 345/168 |
| 5,986,586 A | * | 11/1999 | Tsai | ............................. 341/22 |

* cited by examiner

Primary Examiner—Vijay Shankar
Assistant Examiner—Nitin Patel
(74) Attorney, Agent, or Firm—Rosenberg, Klein & Lee

(57) ABSTRACT

A method for forming a keyboard switching circuit without generating phantom phenomenon is disclosed. The method includes the steps of (1) forming a matrix of nodes with input/output terminals of the keyboard circuit; (2) selecting nodes from the matrix to define a reference diagonal line which divides the matrix into upper and lower portions; (3) selectively selecting nodes of the matrix in the upper and/or lower portions to define diagonal lines parallel to the reference line, the diagonal lines being located at different distance from the reference lines and the nodes of the diagonal lines forming no rectangle with each other; and (4) setting switches in the selected nodes. Since no rectangle can be formed among the switches, no reverse current may be caused by simultaneous actuation of three switches of a rectangle and thus effectively eliminating phantom phenomenon.

3 Claims, 5 Drawing Sheets

METHOD FOR FORMING SWITCHING CIRCUIT OF KEYBOARD WITHOUT GENERATING PHANTOM PHENOMENON

FIELD OF THE INVENTION

The present invention generally relates to a keyboard, such as a computer keyboard and a music instrument keyboard, and in particular to forming a switching circuit of a keyboard without generating phantom phenomenon.

BACKGROUND OF THE INVENTION

A multiple switch keyboard, such as a computer keyboard and a music instrument keyboard comprises a plurality of switches. The arrangement of the switches generally falls in two categories. The first category comprises providing a switch for each input terminal wherein a plurality of switches is required for completing a switching circuit. A great amount of space is thus required for accommodation of the switches. Furthermore, such an arrangement is costly.

The second way of arranging the switches is forming a matrix. This substantially reduces the number of the switches that are required by the first method. The drawbacks related to the first arrangement are eliminated. However, the second arrangement suffers the "phantom phenomenon" which is caused by a reverse current resulting from simultaneous actuation of three switches among four switches arranged at four corners of a rectangle of the switch matrix.

To solve the problem of "phantom phenomenon", diodes are added in the switch matrix for preventing the reverse current. The addition of diodes in the switch matrix leads to increase of costs.

Thus, it is desired to have a method for arranging switches in a keyboard switching circuit to prevent phantom phenomenon without substantially increasing costs.

SUMMARY OF THE INVENTION

Accordingly, an object of the present invention is to provide a method for forming a keyboard switching circuit without generating the phantom phenomenon.

Another object of the present invention is to provide a cheap arrangement of switches of a keyboard switching circuit for eliminating the phantom phenomenon.

To achieve the above objects, in accordance with the present invention, a method for forming a keyboard switching circuit without generating phantom phenomenon is disclosed. The method comprises the steps of (1) forming a matrix of nodes with input/output terminals of the keyboard circuit; (2) selecting nodes from the matrix to define a reference diagonal line which divides the matrix into upper and lower portions; (3) selectively selecting nodes of the matrix in the upper and/or lower portions to define diagonal lines parallel to the reference line, the diagonal lines being located at different distances from the reference lines and the nodes of the diagonal lines forming no rectangle with each other; and (4) setting switches in the selected nodes. Since no rectangle can be formed among the switches, no reverse current may be caused by simultaneous actuation of three switches of a rectangle and thus effectively eliminating the phantom phenomenon.

BRIEF DESCRIPTION OF THE DRAWINGS

The present invention will be apparent to those skilled in the art by reading the following description and explanation with reference to the attached drawings, in which.

DETAILED DESCRIPTION OF THE PREFERRED EMBODIMENT

Figure 1:
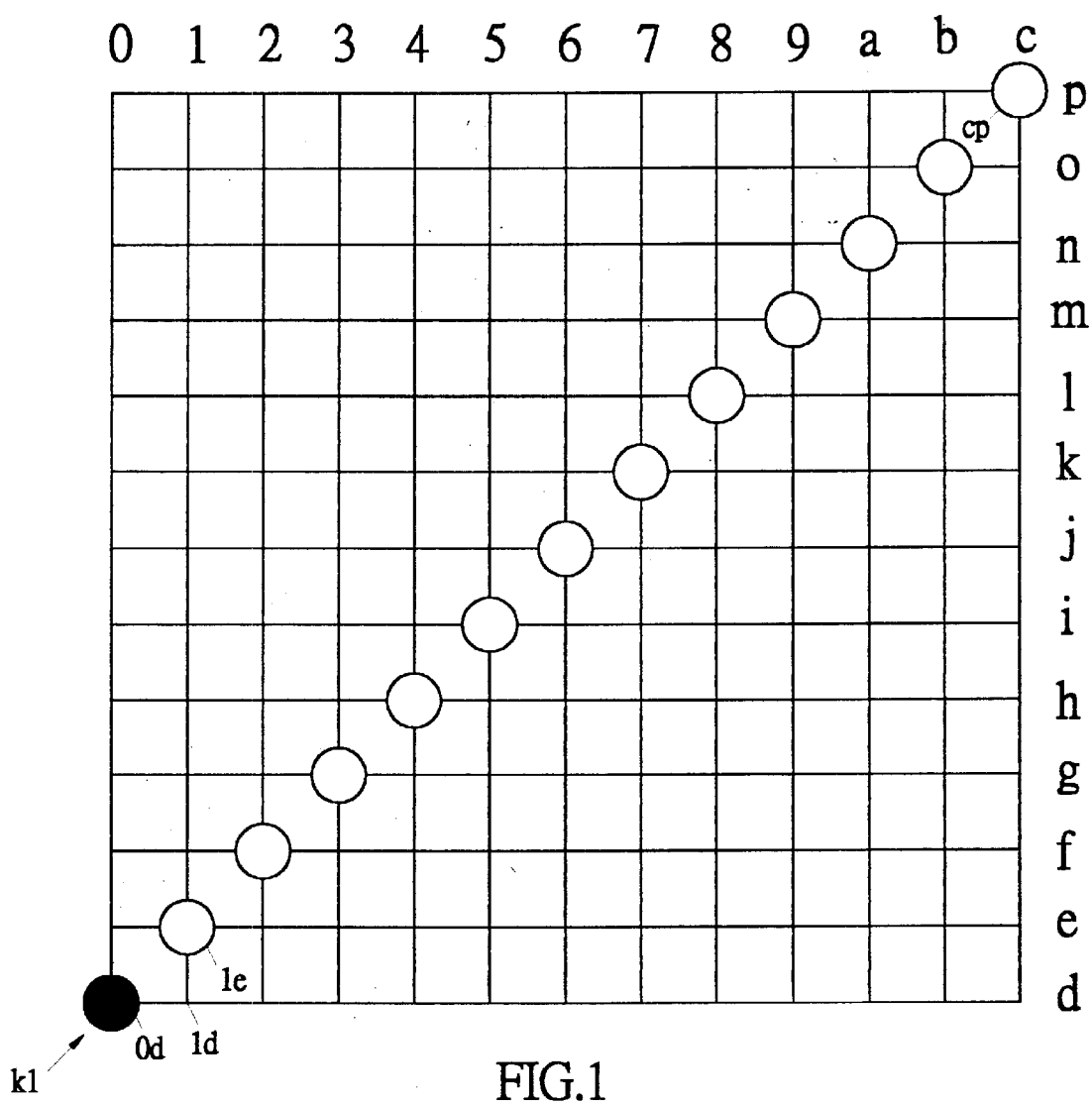
FIG. 1 schematically shows a matrix of nodes formed by input/output terminals of a keyboard switching circuit in accordance with the present invention, a reference diagonal line being formed by suitably selecting nodes of the matrix.
Figure 2:
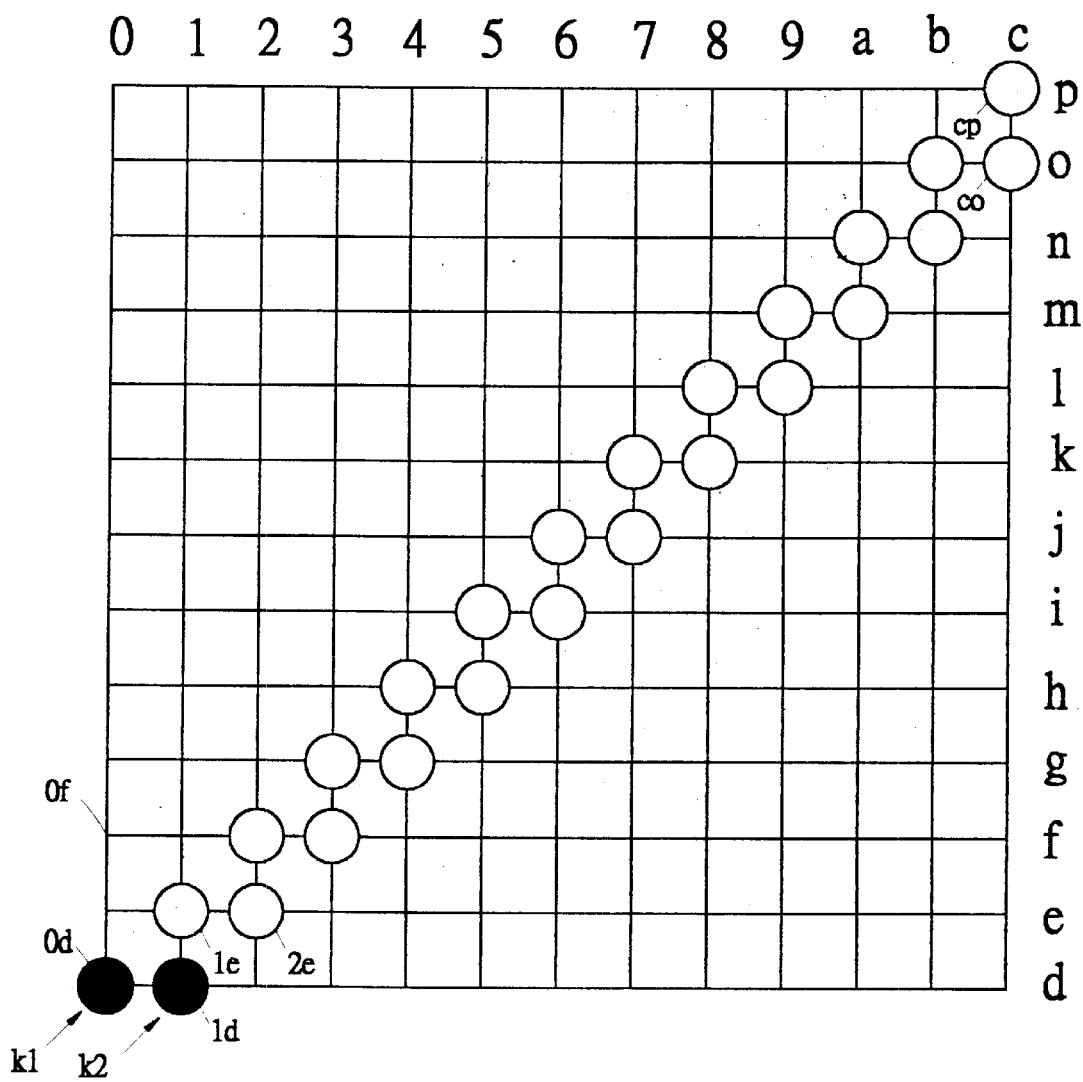
FIG. 2 is similar to FIG. 1 but showing the formation of a second diagonal line in a lower portion of the matrix.
Figure 3:
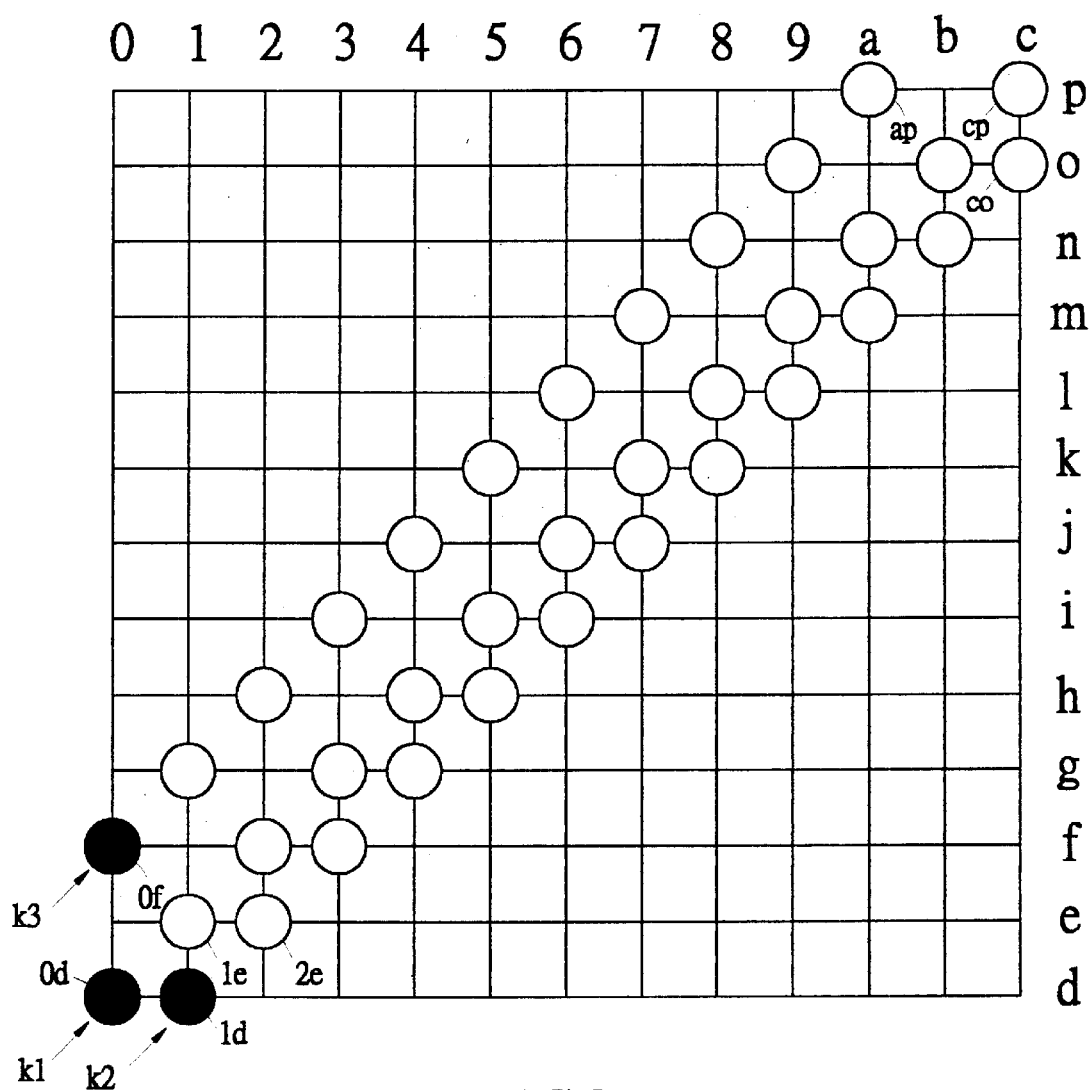
FIG. 3 is similar to FIG. 2 but showing the formation of a third diagonal line in an upper portion of the matrix.
Figure 4:
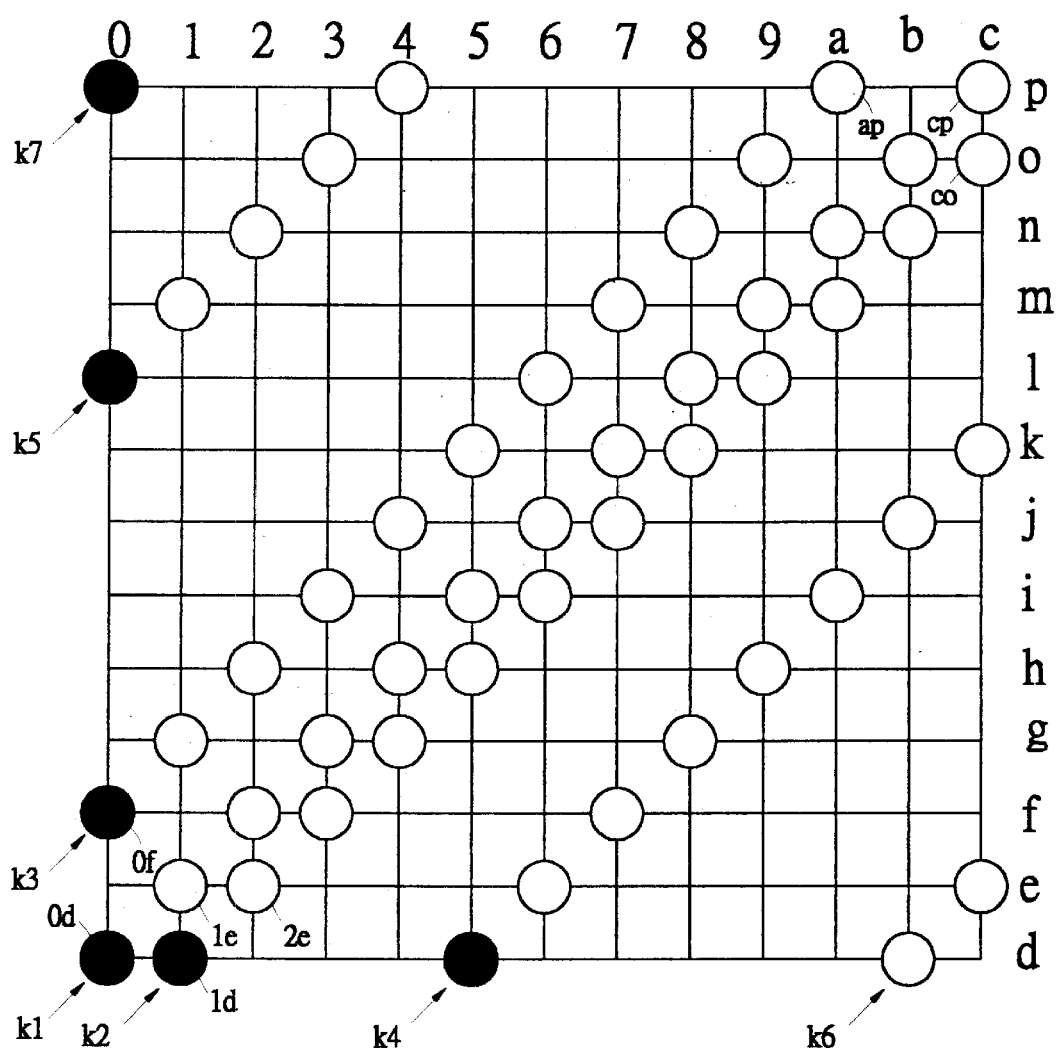
FIG. 4 is similar to FIGS. 2 and 3 but showing the formation of further diagonal lines in both the upper and lower portions of the matrix.

With reference to the drawings and in particular to FIGS. 1–4, an illustration of the arrangement of switches in a keyboard switching circuit will be given for explaining the present invention. In accordance with the present invention, the arrangement of switches of a keyboard switching circuit comprises, in a matrix formed by rows and columns of conductive lines extending from input/output terminals of the circuit, positioning the switches in a number of lines in a diagonal direction, the lines of switches being spaced from each other at different distances. A detailed description is given hereinafter with reference to FIGS. 1–4:

As shown in FIG. 1, a matrix of nodes defined by intersection of rows and columns of conductive lines extending from input/output terminals is formed. In the embodiment illustrated, a 13×13 matrix is formed comprising 13+13=26 input/output terminals 0–9 and a–p, wherein 0–9 and a–c represent columns and d–p represent rows. The rows and columns intersect each other forming a number of nodes. For simplicity, each node will be denoted by reference characters of both column and row, such as 0d, 0e, and 2f.

The diagonal direction defined between nodes 0d and cp, as represented by line k1 of FIG. 1, indicates a reference diagonal direction in which the lines of switches extend. The diagonal line 0d-cp is taken as a "reference diagonal line". The nodes covered by the reference diagonal line will be referred to as reference node. The reference diagonal line k1 divides the matrix into an upper portion and a lower portion.

A line, referred to as the second diagonal line k2 herein, extending parallel to the reference diagonal line k1 is determined. The second diagonal line k2 passes nodes that are at a distance from the reference diagonal line k1 with nodes of the second diagonal lin2 k2 and the reference diagonal line k1 forming no rectangle with each other and thus causing no phantom phenomenon. In the embodiment illustrated, the nodes of the second diagonal line k2 are located at the shortest distance from the reference diagonal line k1.

The nodes of the second diagonal line k2 may be either in the upper portion or in the lower portion. In the example, the nodes of the second diagonal line k2 is selected from the lower portion. An example is the node between column 1 and row d, namely node 1d. By this selection, switches set in the reference diagonal line k1 and the second diagonal line k2 do not lead to phantom phenomenon for there are no four switches located at four corners of a rectangle as can be easily understood from FIG. 2.

A third diagonal line k3 is selected such that the third diagonal line k3 runs parallel to the first and second diagonal lines k1 and k2 and is located on opposite portion of the matrix with respect to the second like k2, namely in the upper portion of the matrix. The third diagonal line k3 is selected so that nodes, such as node 0f, covered by the third diagonal line k3 are located at a distance from the reference diagonal line k1 that is different from that of the second diagonal line k2. In the embodiment illustrated, the distance of the third diagonal line k3 from the reference diagonal line k1 is a distance that is shortest from the reference diagonal line k1 but is different from that between the reference diagonal line k1 and the second diagonal line k2 whereby no node of the third diagonal line k3 forms a rectangle with the nodes of the first and second diagonal lines k1 and k2. Accordingly, an imagery diagonal line comprised of un-selected nodes is present between the third diagonal line k3 and the first diagonal line k1 which is a symmetry of the second diagonal line k2 with respect to the reference or first diagonal line k1. It is easily understood that switches arranged on the first, second and third lines k1, k2, k3 do not lead to phantom phenomenon for no rectangle can be formed by the switches.

Based on the same principle, fourth, fifth, sixth and seventh diagonal lines k4, k5, k6, k7 can be determined whereby their nodes form no rectangle either with other nodes thereof or with nodes of the first, second and third diagonal lines k1, k2, k3. The fourth, fifth, sixth and seventh diagonal lines k4-k7, similar to and together with the second and third diagonal lines k2 and k3 are alternatively located in the lower and upper portions of the matrix and run parallel to each other and the first diagonal line k1.

The distance of each of the fourth, fifth, sixth and seventh diagonal lines k4-k7 from the reference diagonal line k1 is different from each other and different from those of the second and third diagonal lines k2 and k3. In the embodiment illustrated, the distance of the second, third, fourth, fifth, sixth and seventh diagonal lines k2-k7 is incrementally increased. In other words, assuming the distance between the reference diagonal line (the first line) k1 and the second diagonal line k2 is one unit, then the distance between the reference diagonal line k1 and the third diagonal line k3 is two unit, the distance between the reference diagonal line k1 and the fourth diagonal line k4 is three units, the distance between the reference diagonal line k1 and the fifth diagonal line k5 is four units, the distance between the reference diagonal line k1 and the sixth diagonal line k6 is five units and the distance between the reference diagonal line k1 and the seventh diagonal line k7 is sixth units. This principle can be extended to unlimited number of diagonal lines of switches.

Figure 5:
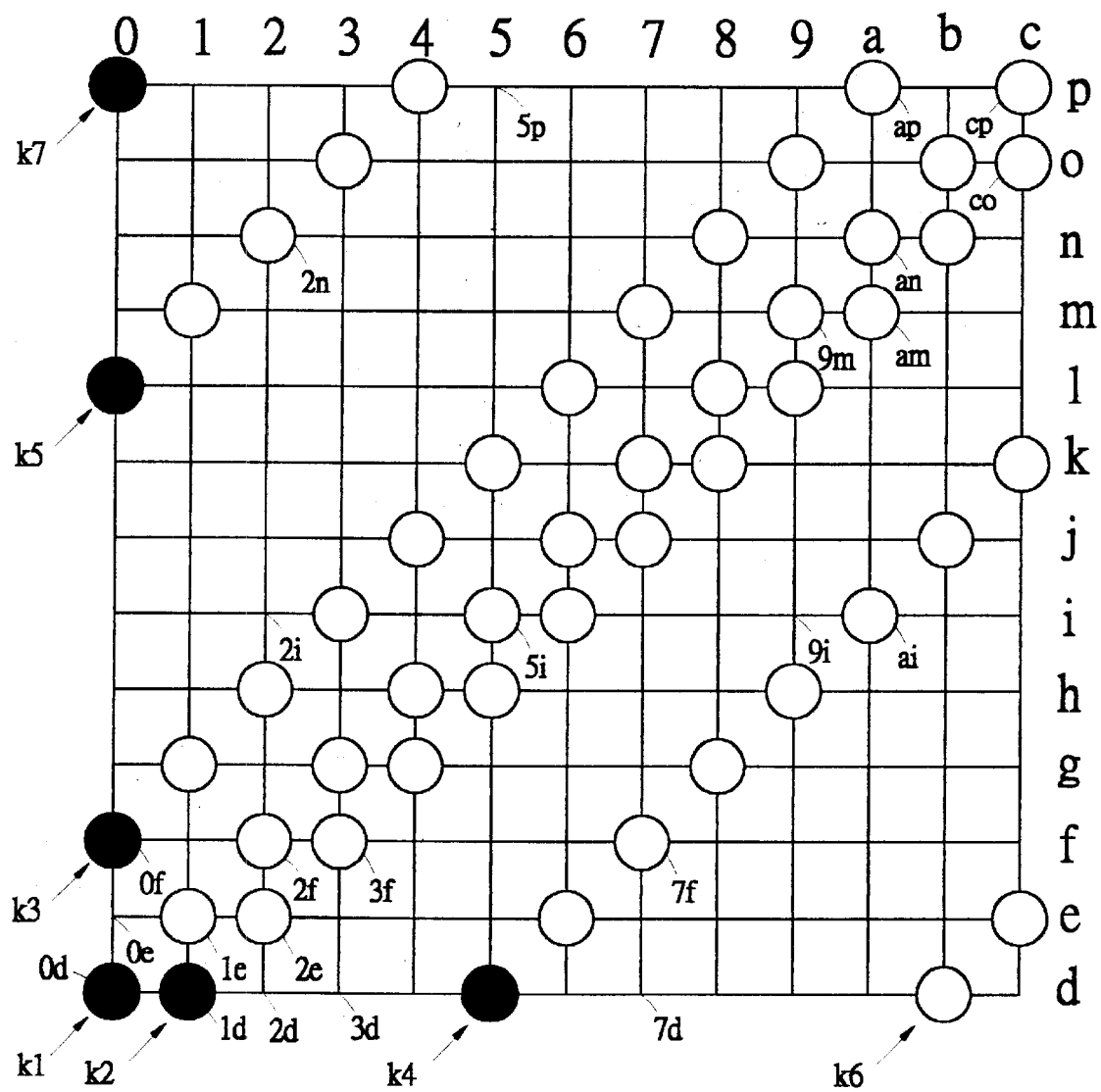
FIG. 5 is similar to FIG. 4 with more nodes being designated for explanation of the principle of the present invention.

It can be easily understood from FIGS. 1–4 that no rectangle can be formed with the nodes selected from any of the diagonal lines k1-k7 chosen in this way. Thus no phantom phenomenon can be observed by placing switches on the nodes of the diagonal lines k1-k7. By selecting the diagonal lines in such a way that they are alternatively located in different portions (the upper and lower portions) of the matrix and that their distances from a reference diagonal line is increased in an incremented fashion, the phantom phenomenon caused by reverse current resulting from simultaneous actuation of three switches can be completely eliminated. This will be further explained Also referring to FIG. 5, taking node 0d of the first diagonal line k1 as an example. Node 0d forms a rectangle with nodes 1d, 1e and 0e. Since node 0e is not located in any of the diagonal lines, in other words node 0e is not selected to position a switch, no short-circuiting may occur and thus no phantom phenomenon may take place.

Taking node 0f of the third diagonal line k3 as another example. Node 0f may form a rectangle with nodes 2f, 2d and 0d. Since no switch is set in node 2d, the occurrence of phantom phenomenon is eliminated. Node 0f may also form a rectangle with nodes 3f, 3d and 0d. Similarly, no switch is set is node 3d and thus no phantom phenomenon will occur. Node 0f may also form a rectangle with nodes 7f, 7d and 0d. Similarly, no switch is set is node 7d and thus no phantom phenomenon will occur Further taking node ai of the fourth diagonal line k4 as an example. Node ai may form a rectangle with nodes am, 9m and 9i. Since no switch is set in node 9i, phantom phenomenon cannot occur thereamong. Node ai may also form a rectangle with nodes an, 2n and 2i. Similarly, no switch is set is node 2i and thus no phantom phenomenon will occur. Node ai may also form a rectangle with nodes ap, 5p and 5i. Similarly, no switch is set is node 5i and thus no phantom phenomenon will occur.

It can be concluded from the above description and explanation that every node of the diagonal lines k1-k7 forms no rectangle with other nodes of these lines k1-k7. Thus a switching circuit with switches set in the nodes of the diagonal lines k1-k7 causes no phantom phenomenon at all. Furthermore, since no reverse current may occur in the switching circuit, no diode is needed. The costs of manufacture are thus substantially reduced.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for forming a switching circuit of a keyboard comprising the following steps:
   (1) forming a matrix of intersection nodes of input/output terminals, the matrix having a diagonal direction;
   (2) selecting nodes of the matrix to define a first, reference diagonal line extending in the diagonal direction, the reference line dividing the matrix into first and second portions;
   (3) selecting nodes of the matrix in the first portion to define a first portion diagonal line, the first portion diagonal line being parallel to the reference line, the nodes of the first portion diagonal line being located at a first distance from the reference line and forming no rectangle with the nodes of the reference line;
   (4) selecting nodes of the matrix in the second portion to define a second portion diagonal line; the second portion diagonal line being parallel to the reference line, the nodes of the second portion diagonal line being located at a second distance different from the first distance and forming no rectangle with the nodes of the reference line and the first portion diagonal line; and
   (5) setting switches in the nodes of the diagonal lines.

2. The method as claimed in claim 1 further comprising the following step after step (4):
   (a) further selecting nodes of the matrix in the first portion to define another first portion diagonal line which is parallel to the reference line and located at a third distance from the reference line, the third distance being different from the first and second distances, the nodes of the another first portion diagonal line forming no rectangle with the nodes of other diagonal lines.

3. The method as claimed in claim 2 further comprising the following step:
   (b) selectively repeating step (4) and step (a) to selectively define further diagonal lines in the first and second portions of the matrix.

* * * * *